(12) United States Patent
Lin et al.

(10) Patent No.: US 6,977,227 B2
(45) Date of Patent: Dec. 20, 2005

(54) METHOD OF ETCHING BOTTLE TRENCH AND FABRICATING CAPACITOR WITH SAME

(75) Inventors: Shian-Jyh Lin, Chiayi Hsien (TW); Yu-Sheng Hsu, Taoyuan (TW); Chung-Yuan Lee, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/871,619

(22) Filed: Jun. 18, 2004

(65) Prior Publication Data

US 2005/0208727 A1 Sep. 22, 2005

(30) Foreign Application Priority Data

Mar. 18, 2004 (TW) ............................... 93107227 A (51) Int. Cl.[7] .......................................... H01L 21/311
(52) U.S. Cl. ...................... 438/700; 438/243; 438/386
(58) Field of Search ............................... 438/700, 745, 438/706, 733, 680, 689, 663, 637, 243, 386

(56) References Cited

U.S. PATENT DOCUMENTS

| | | | | |
|---|---|---|---|---|
| 5,658,816 A | * | 8/1997 | Rajeevakumar | ............. 438/386 |
| 6,566,273 B2 | * | 5/2003 | Kudelka | ...................... 438/733 |
| 6,716,696 B2 | * | 4/2004 | Chen et al. | ................. 438/243 |
| 6,716,757 B2 | * | 4/2004 | Lin et al. | ..................... 438/705 |
| 6,800,535 B1 | * | 10/2004 | Tsai et al. | .................... 438/386 |
| 6,825,094 B2 | * | 11/2004 | Wu et al. | .................... 438/386 |
| 6,838,334 B1 | * | 1/2005 | Gluschenkov et al. | ...... 438/243 |

OTHER PUBLICATIONS

Jun-Ian Chang, "Physics and Technology of Semiconductor Device", Mar., 1990, Scholar Books Co., Ltd., pp. 518-521, Taiwan.
Hong Xiao, *Introduction to Semiconductor Manufacturing Technology*, Aug. 1992, pp. 312-313, Pearson Education Company, Taiwan.

* cited by examiner

*Primary Examiner*—David Nhu
(74) *Attorney, Agent, or Firm*—Quintero Law Office (57) ABSTRACT

A method for forming a bottle trench. First, a substrate covered by a photoresist layer is rotated to a specific angle prior to performance of lithography, thereby forming a rectangular opening in the photoresist layer and exposing the substrate, in which edges of the rectangular opening are substantially parallel to the {110} plane of the substrate due to the rotation of the substrate. Next, the exposed substrate is etched to form a trench therein, in which the sidewall surface of the trench is the {110} plane of the substrate. Finally, isotropic etching is performed on the substrate of the lower portion of the trench using an etching shield layer formed on the sidewall of the upper portion of the trench as an etching mask, to form the bottle trench. The invention also discloses a method of fabricating a bottle trench capacitor.

18 Claims, 11 Drawing Sheets

METHOD OF ETCHING BOTTLE TRENCH AND FABRICATING CAPACITOR WITH SAME

BACKGROUND

The present invention relates to the manufacture of a semiconductor device and in particular to a method of fabricating a bottle trench in a semiconductor substrate for formation of a capacitor in dynamic random access memory (DRAM).

As the integration density of dynamic random access memory (DRAM) steadily increases, reduced memory cell size is necessary. The memory cell size is primarily determined by the minimum resolution dimensions of a lithographic technique, the overlay tolerance between the different features and the layout of these features. At the same time, it is necessary to maintain the minimum required storage capacitance to reliably operate the DRAM. To meet both the cell size and storage capacitance requirements, a trench capacitor has been invented; the simple single device/capacitor memory cell has been altered to provide a vertical trench capacitor. In such designs, the capacitor is formed in a trench in the surface of the semiconductor substrate.

Since each DRAM cell only requires a transistor and a capacitor, high integration for DRAM can be accomplished as compared with other memories, such that DRAMs are widely employed in computer and electronic products.

However, as the size of a DRAM is scaled down by a factor of f (feature size), the trench storage node capacitance decreases by a factor of f. Therefore, it is important to develop methods to increase storage capacitance. One method employed to increase capacitance is to widen the lower portion of a trench, thus, increasing the surface area and creating a "bottle shaped" capacitor.

SUMMARY

Accordingly, an object of the invention is to provide a method for forming a bottle trench to enlarge the bottom area thereof.

It is another object of the present invention to provide a method for forming a bottle trench, such that conventional bottle etching recipes can be utilized.

It is a further object of the present invention to provide a method of fabricating a bottle trench capacitor to increase the capacity of the bottle trench capacitor.

One aspect of the present invention is to form a trench in a substrate, in which the sidewall surface of the trench is the {110} plane of the substrate. The etching rate of the {110} plane of the substrate is faster than that of {100} plane of the substrate. Therefore, after bottle etching, the enlarged bottom area of the bottle trench of an embodiment of the present invention is achieved using a conventional bottle etching recipes.

To achieve the above objects, an embodiment of the present invention provides a method for forming a bottle trench. First, a substrate covered by a photoresist layer is provided. Next, the substrate is rotated to a specific angle and lithography is subsequently performed on the photoresist layer to form a rectangular opening therein and expose the surface of the substrate, in which the edges of the rectangular opening are substantially parallel to the {110} plane of the substrate due to the rotation of the substrate. Next, the exposed substrate is etched to form a trench therein, in which the sidewall surface of the trench is the {110} plane of the substrate. Thereafter, an etching shield layer is formed on the upper portion of the sidewall of the trench. Finally, the lower portion of the trench is isotropically etched using the etching shield layer as an etching mask, to form a bottle trench.

The substrate comprises silicon, and the etching shield layer comprises silicon dioxide. Moreover, the isotropic etching comprises wet etching and the wet etching solution comprises KOH, NH$_4$OH, HNO$_3$, or NH$_3$. Additionally, the substrate is rotated to a specific angle of about 45°, 135°, 225°, or 315°.

To achieve the above objects, another embodiment of the present invention also provides a method of fabricating a bottle trench capacitor. First, a substrate on which a masking layer and a photoresist layer are successively formed is provided. Next, the substrate is rotated to a specific angle and lithography is subsequently performed on the photoresist layer to form a rectangular opening therein and expose the surface of the masking layer, in which the edges of the rectangular opening are substantially parallel to the {110} plane of the substrate due to the rotation of the substrate. Next, the exposed masking layer is etched to transfer the rectangular opening therein and expose the underlying substrate. Thereafter, the photoresist layer is removed. Next, the exposed substrate is etched to form a trench therein, in which the sidewall surface of the trench is the {110} plane of the substrate. Thereafter, an etching shield layer is formed on the upper portion of the sidewall of the trench. Next, the lower portion of the trench is isotropically etched using the etching shield layer as an etching mask, to form a bottle trench. Next, a bottom electrode is formed in the substrate of the lower portion of the bottle trench. Finally, a dielectric layer is conformably formed on the surface of the lower portion of the bottle trench and then a top electrode is formed in the bottle trench.

A detailed description is given in the following embodiments with reference to the accompanying drawings.

BRIEF DESCRIPTION OF THE DRAWINGS

Embodiments of the present invention can be more fully understood by reading the subsequent detailed description and examples with references made to the accompanying drawings, wherein.

DETAILED DESCRIPTION

First Embodiment

The method for forming a bottle trench according to a first embodiment of the present invention is described in the following.

Figure 1:
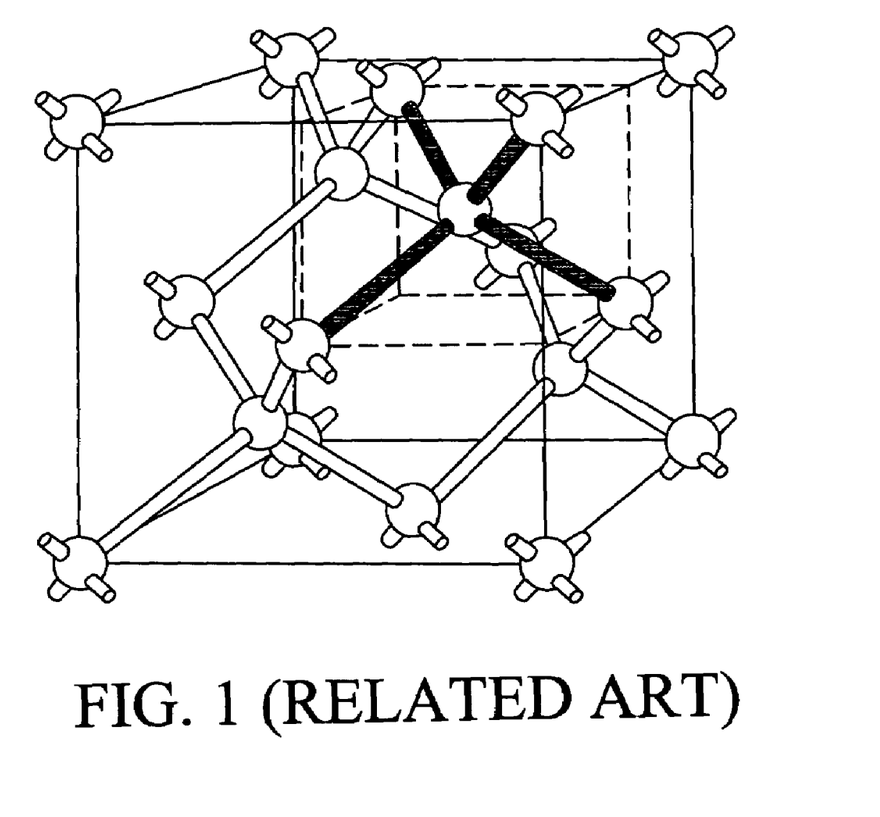
FIG. 1 is a sketch illustrating the crystal structure of silicon as is well known in the art.
Figure 2A:
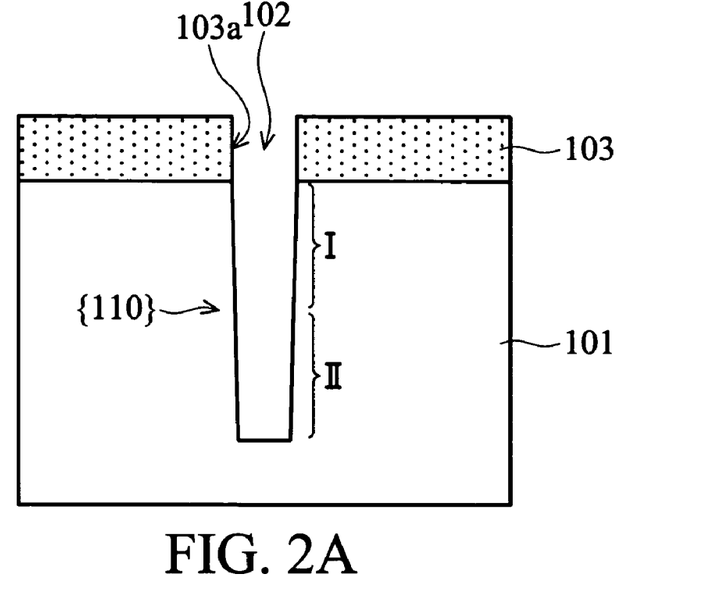
FIGS. 2A through 2D are cross-sections showing the method for forming a bottle trench according to a first embodiment of the invention.

First, in FIG. 2A, a substrate 101 is provided. In this embodiment, the substrate 101 can be a silicon wafer. Typically, silicon has a diamond crystal structure, as shown in FIG. 1. Moreover, the diamond crystal structure contains a body-centered cubic (BCC) crystal structure, indicated by a dotted line shown in FIG. 1. Next, a photoresist layer 103 is formed overlying the substrate 101.

Next, a critical step of this embodiment is performed. The substrate 101 is rotated to a specific angle and lithography is performed on the photoresist layer 103, to form a rectangular opening 103a and expose the underlying substrate 101. The edges of the rectangular opening 103a are substantially parallel to the {110} plane of the substrate 101 due to the rotation of the substrate 101. In general, the lithography tool (not shown) is aligned with a <100> direction of the substrate 101, for example, the substrate 101 can be rotated to an angle of about 45°, 135°, 225°, or 315°, such that the alignment direction is changed from <100> to <110>.

Next, anisotropic etching, such as plasma dry etching, is performed to etch the exposed substrate 101 under the rectangular opening 103a, to form a trench 102 therein. As a result, the exposed sidewall surface of the trench 102 is the {110} plane of the substrate 101. Moreover, the trench 102 is divided into two parts comprising an upper portion I and a lower portion II.

Figure 2B:
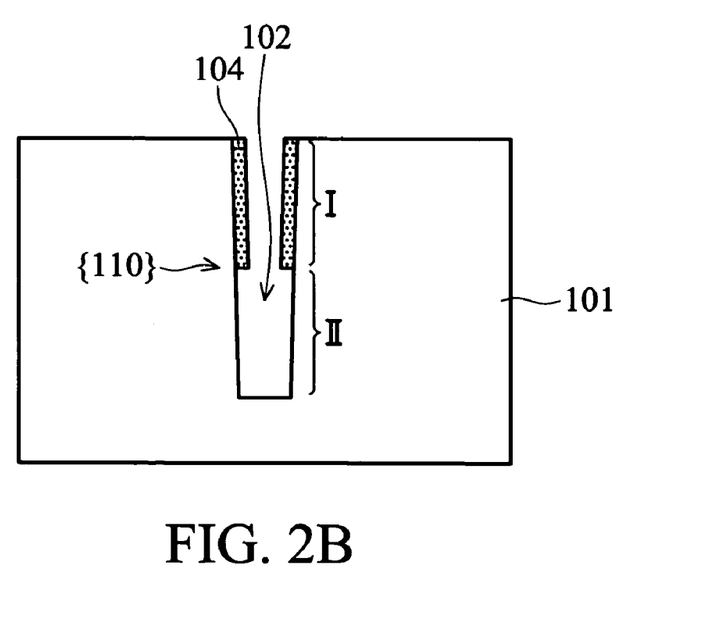

Next, in FIG. 2B, an etching shield layer 104 is formed on the upper portion I of the trench 102. Preferably, the etching shield layer 104 can be a conventional anti-collar for the fabrication of the bottle trench, which comprises silicon dioxide. Moreover, the etching shield layer 104 provides protection for the upper portion I of the trench 102 when the lower portion II of the trench 102 is etched to enlarge the surface area thereof.

Figure 2C:
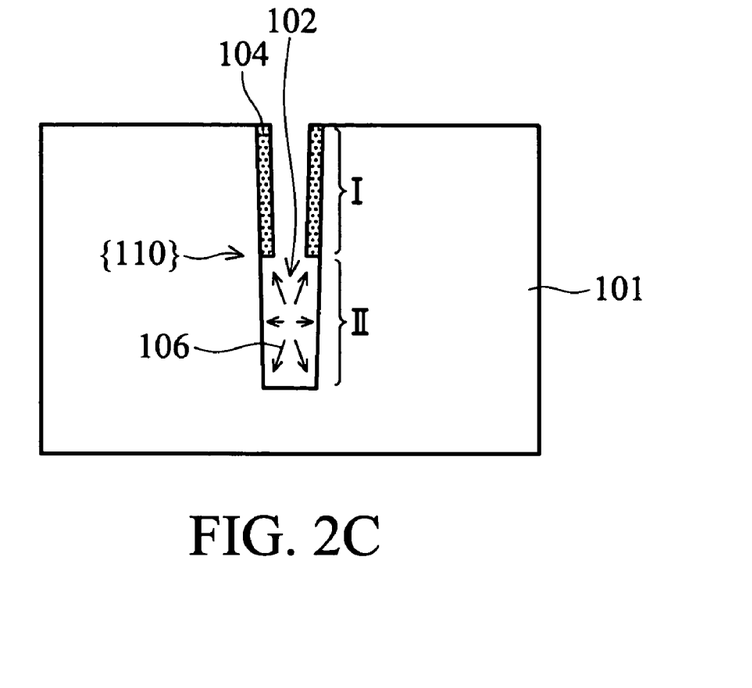
Figure 2D:
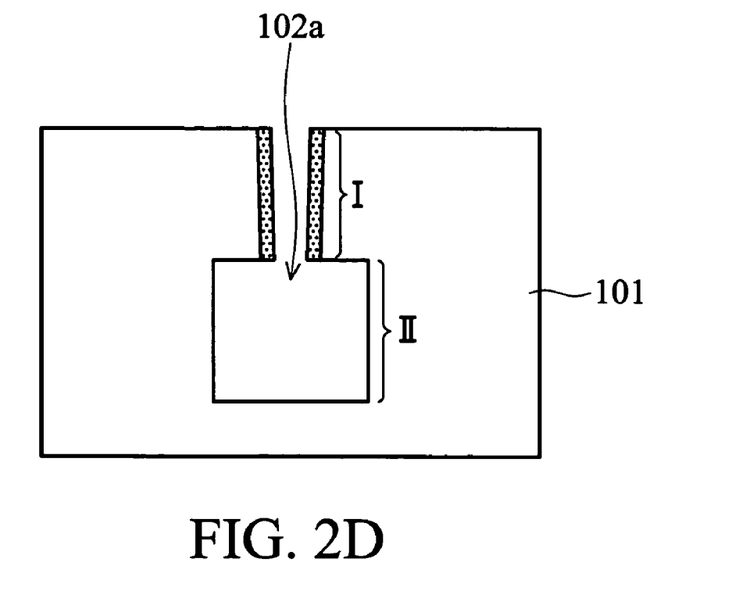

Thereafter, in FIG. 2C, isotropic etching 106, such as a wet etching, is performed on the lower portion II of the sidewall of the trench 102 using the etching shield layer 104 as an etching mask so as to enlarge the surface area of the lower portion II of the trench 102. The etching solution employed in the wet etching preferably comprises KOH, $NH_4OH$, $HNO_3$, or $NH_3$. As a result, a bottle trench 102a is obtained, as shown in FIG. 2D.

Figure 3:
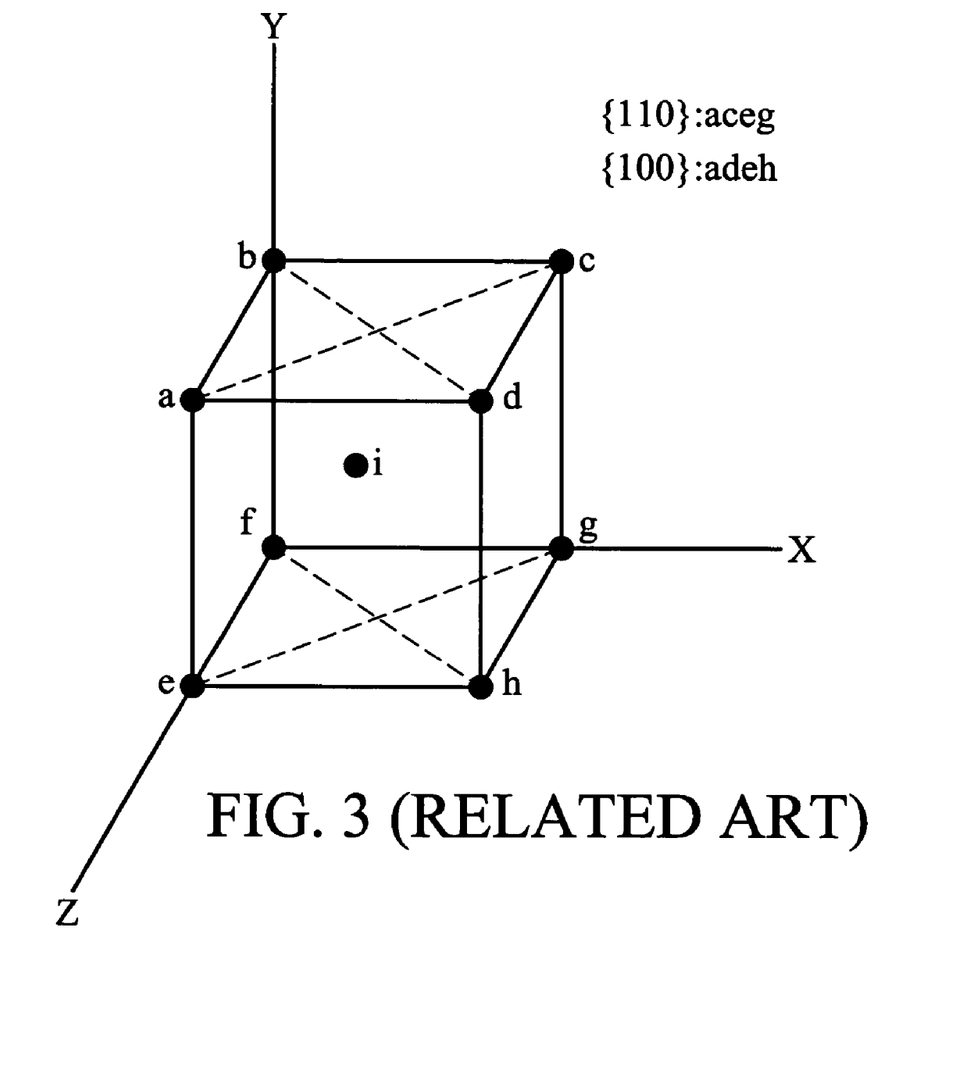
FIG. 3 is a sketch illustrating the crystal structure of a body-centered cubic structure as is well known in the art.

FIG. 3 illustrates the crystal structure of a body-centered cubic structure comprising atoms a, b, c, d, e, f, g, h, and i as is well known in the art. There are more atomic numbers in the {110} plane indicated by a dotted line (for example, the plane constituted by atoms a, c, e, and g) than that in the {100} plane indicated by a solid line (for example, the plane constituted by atoms a, d, e, and h). Thus, in the same etching recipes, the etching rate of the {110} plane is faster than that of the {100} plane. According to this embodiment, the sidewall surface of the trench 102 is the {110} plane of the substrate 101, rather than the conventional {100} plane. Accordingly, after bottle etching, the surface area of the bottle trench 102a can be greatly increased, even if conventional etching recipes are employed for fabrication of the bottle trench 102a.

Second Embodiment

The formation of a trench capacitor according to a second embodiment of the present invention is described as following.

Figure 4A:
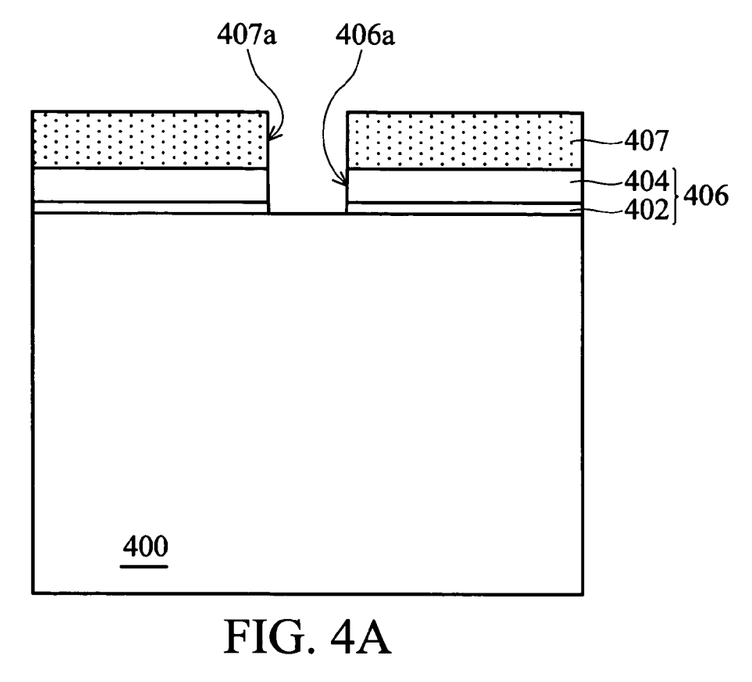
FIGS. 4A through 4L are cross-sections showing the method of fabricating a bottle trench capacitor according to a second embodiment of the invention.

First, in FIG. 4A, a substrate 400 is provided. In this embodiment, the substrate 400 can be a silicon wafer. As mentioned above, silicon has a diamond crystal structure, as shown in FIG. 1. Moreover, the diamond crystal structure contains a body-centered cubic (BCC) crystal structure, indicated by a dotted line shown in FIG. 1. Next, a masking layer 406 is formed overlying the substrate 400, which can be a single layer or multiple layers. Preferably, the masking layer comprises a pad oxide layer 402 and a thick silicon nitride layer 404, as shown in FIG. 4A. Thereafter, a photoresist layer 407 is formed on the masking layer 406.

Next, a critical step of this embodiment is performed. The substrate 400 is rotated to a specific angle and lithography is performed on the photoresist layer 407, to form a rectangular opening 407a and expose the underlying masking layer 406. The edges of the rectangular opening 407a are substantially parallel to the {110} plane of the substrate 400 due to the rotation of the substrate 400. As mentioned above, the lithography tool (not shown) is aligned with a <100> direction of the substrate 400, for example, the substrate 400 can be rotated to an angle of about 45°, 135°, 225°, or 315°, such that the alignment direction is changed from <100> to <110>.

Next, the exposed masking layer 406 under the rectangular opening 407a is etched to transfer the rectangular opening 407a therein, to form a rectangular opening 406a and expose the underlying substrate 400. As a result, the edges of the rectangular opening 406a are also substantially parallel to the {110} plane of the substrate 400.

Figure 4B:
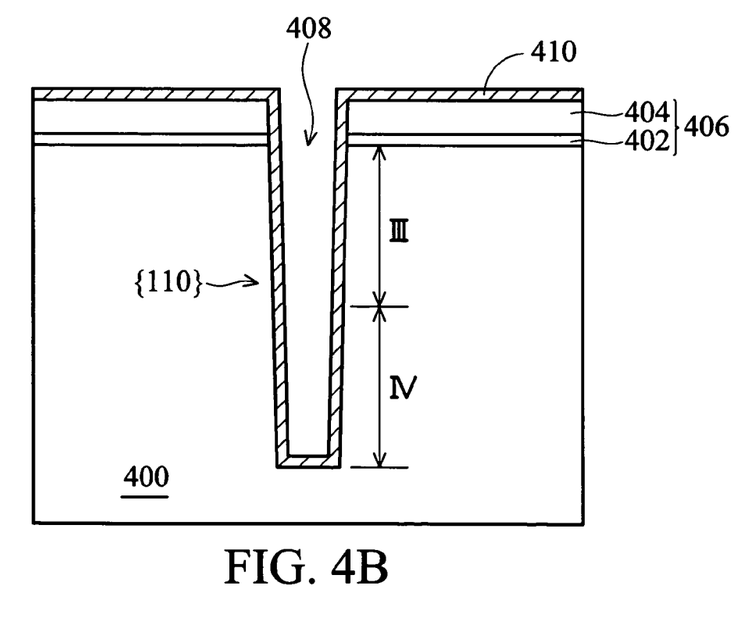

Next, in FIG. 4B, the photoresist layer 407 is removed as it is no longer needed. Thereafter, anisotropic etching, such as plasma dry etching, is performed to etch the exposed substrate 400 under the rectangular opening 406a, to form a trench 408 therein. As a result, the exposed sidewall surface of the trench 408 is the {110} plane of the substrate 400. Moreover, the trench 408 is divided into two parts comprising an upper portion III and a lower portion IV.

Next, a thin silicon nitride layer 410 with a thickness of about 15 to 30 Å is conformably formed on the surface of the trench 408 by, for example, chemical vapor deposition (CVD) using $SiH_2Cl_2$ and $N_2$ or $NH_3$ as process gases.

Figure 4C:
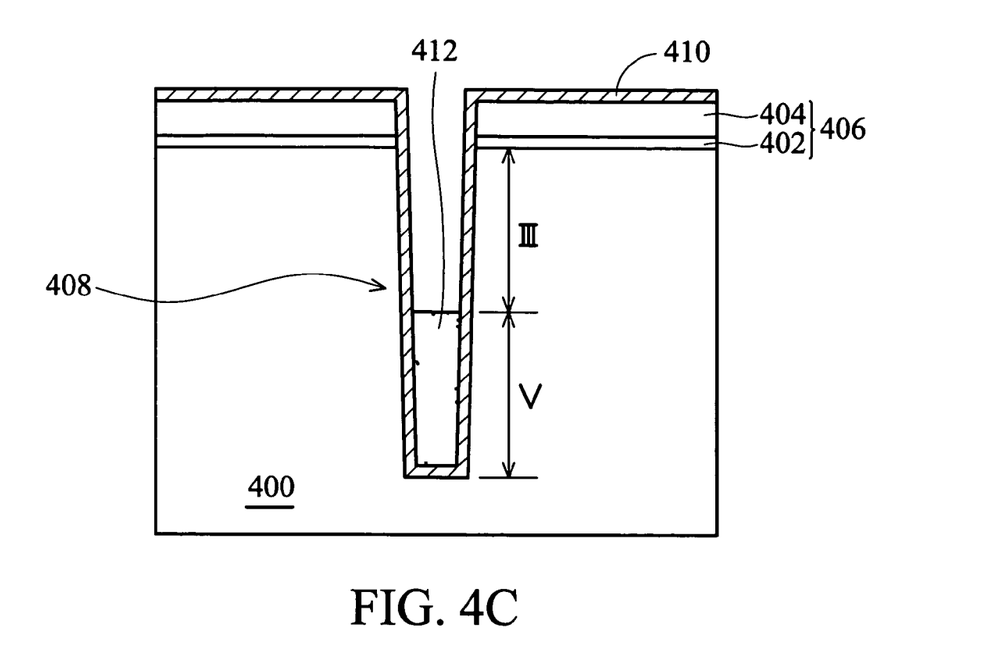

Next, in FIG. 4C, a photoresist layer (not shown) is formed on the thin silicon nitride layer 410 and fills the trench 408. The photoresist layer in the upper portion III of the trench 408 is removed by etching, to leave a portion of photoresist layer 412 in the lower portion IV of the trench 408 to serve as a masking material for silicon nitride etching.

Figure 4D:
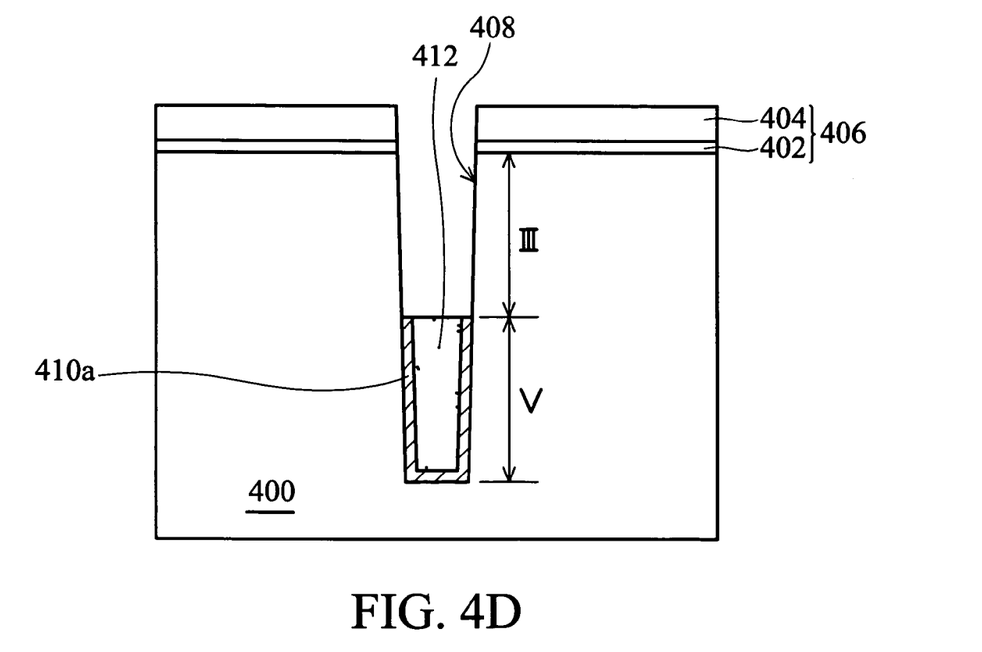

Next, in FIG. 4D, the thin silicon nitride layer 410 uncovered by the masking material 412 is removed by wet etching using phosphate as an etching solution, so as to expose the substrate 400 of the upper portion III of the trench 408 and leave a portion of thin silicon nitride layer 410a.

Figure 4E:
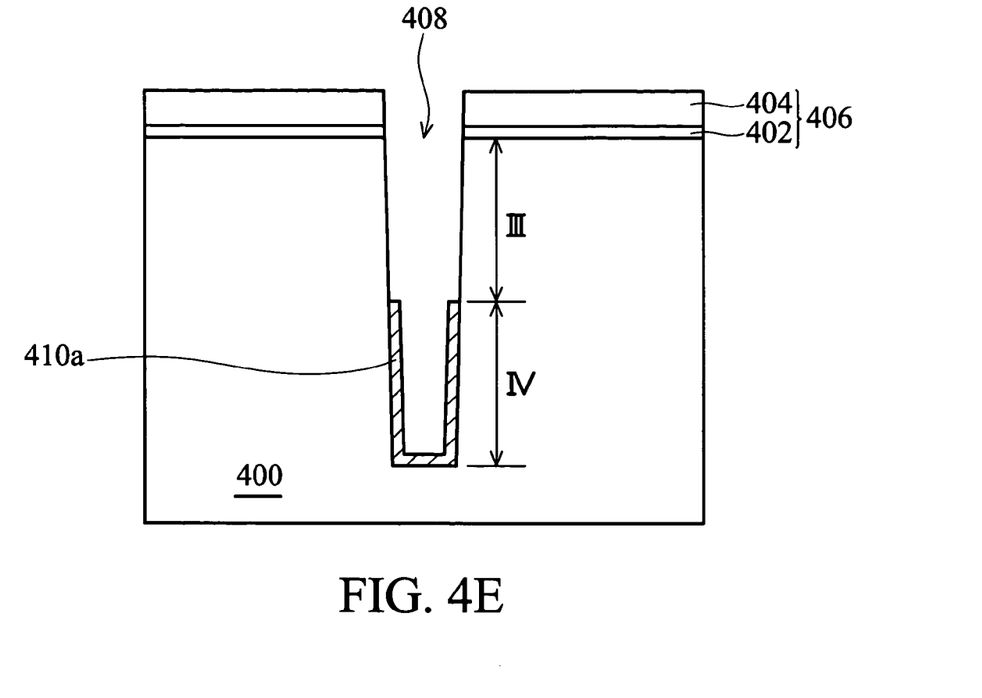

Next, in FIG. 4E, the masking material comprising photoresist is removed to expose the remaining silicon nitride layer 410a in the lower portion IV of the trench 408.

Figure 4F:
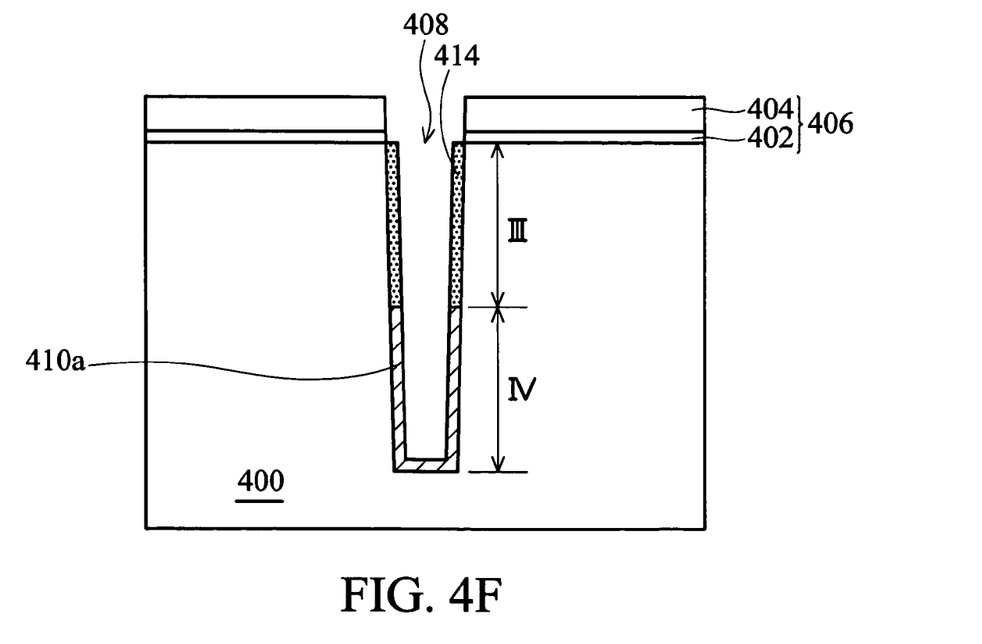

Next, in FIG. 4F, rapid thermal oxidation (RTO) is performed on the substrate 400 of the upper portion III of the trench 408 by injecting $O_2$ and/or $H_2O$ at a high temperature of 650° C. to 800° C., to form a thin silicon dioxide layer 414 with a thickness of about 50 to 200 Å, which serves as an etching shield layer for subsequent bottle etching.

Figure 4G:
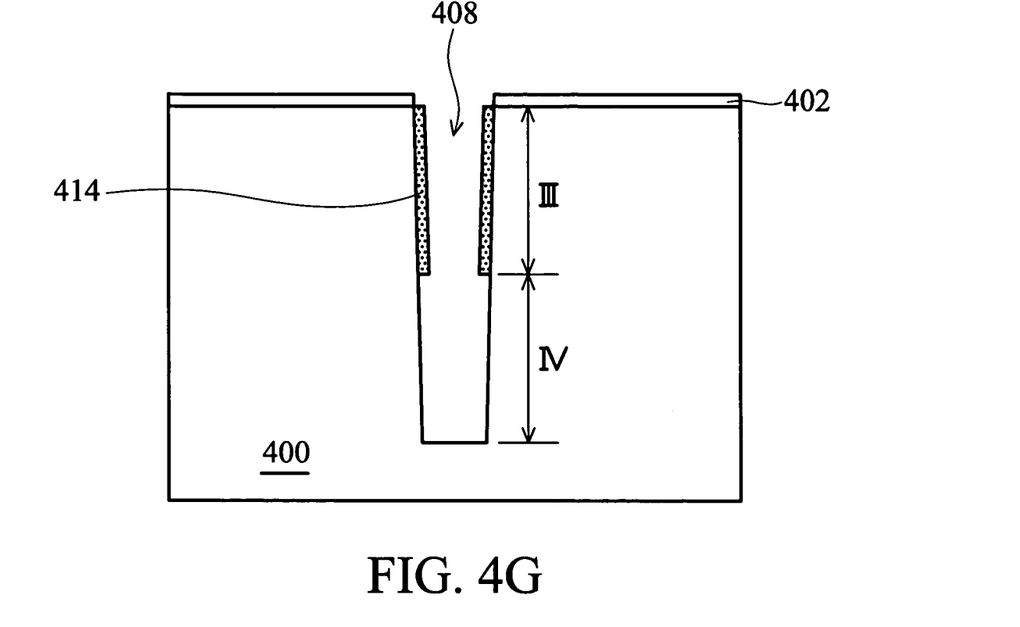

Next, in FIG. 4G, the silicon nitride layer 404 over the trench 408 and the thin silicon nitride layer 410a in the lower portion IV of the trench 408 are removed by a suitable solution.

Figure 4H:
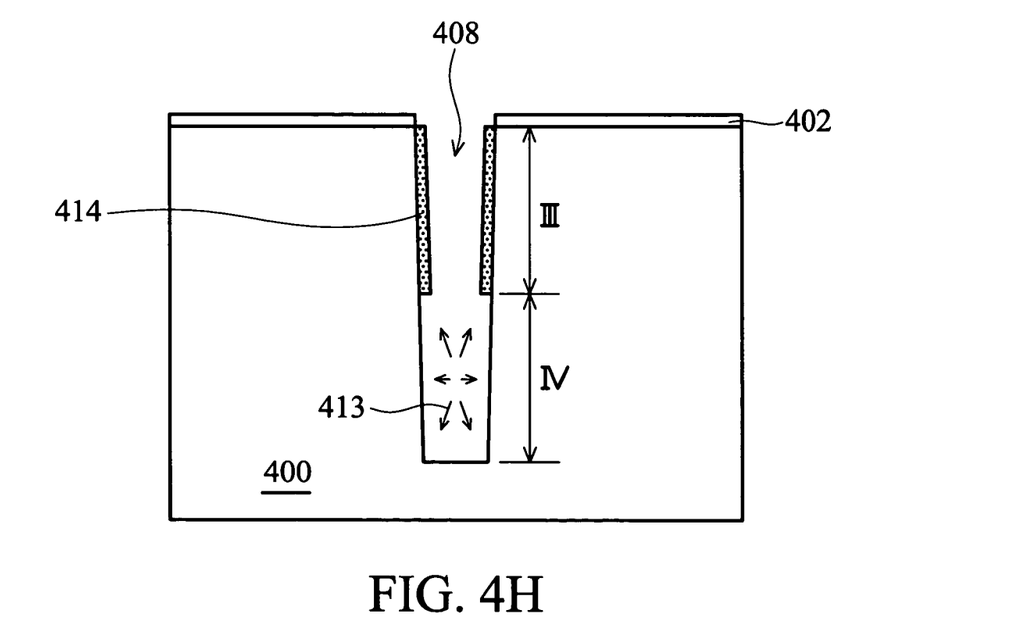
Figure 4I:
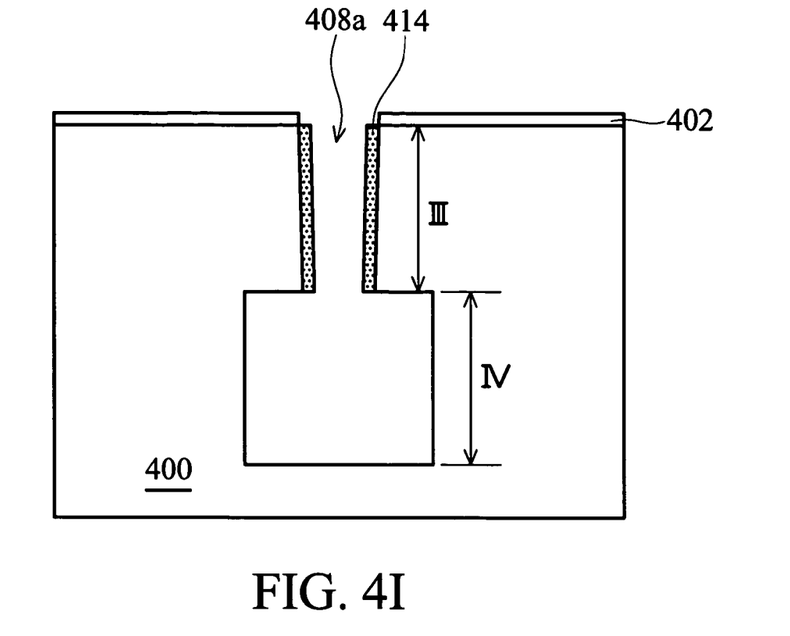

Next, in FIG. 4H, isotropic etching 413, such as wet etching, is performed on the substrate 400 of the lower portion IV of the trench 408 using the etching shield layer 414 comprising silicon dioxide as an etching mask, to enlarge the surface area of the lower portion IV of the trench 408. The etching solution employed in the wet etching preferably comprises KOH, $NH_4OH$, $HNO_3$, or $NH_3$. As a result, a bottle trench 408a is obtained, as shown in FIG. 4I.

As shown in FIG. 3, there are more atomic numbers in the {110} plane indicated by a dotted line (for example, the plane constituted by atoms a, c, e, and g) than that in the {100} plane indicated by a solid line (for example, the plane constituted by atoms a, d, e, and h). Thus, in the same etching recipes, the etching rate of the {110} plane is faster than that of the {100} plane. According to this embodiment, the sidewall surface of the trench 408 is the {110} plane of the substrate 400, rather than the conventional {100} plane.

Accordingly, after bottle etching, the surface area of the bottle trench 408a can be greatly increased, even if conventional etching recipes are employed for fabrication of the bottle trench 408a.

Figure 5:
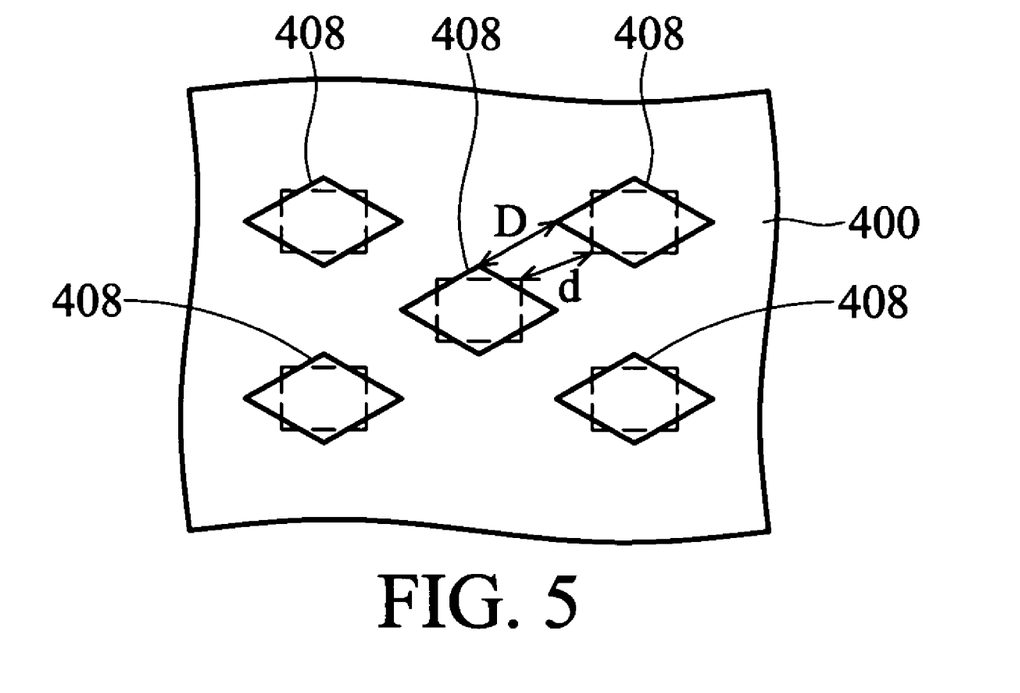
FIG. 5 is a top-view showing the arrangement of the trenches according to the embodiments of the invention.

FIG. 5 is a top-view showing the arrangement of the trenches. In FIG. 5, the trenches 408 formed by a previous rotation of the substrate 400 are indicated by solid lines and the trenches 408 formed without the previous rotation of the substrate 400 are indicated by dotted lines. As shown in FIG. 5, the critical dimension (CD) of the trenches 408 formed by a previous rotation of the substrate 400 according to the second embodiment of the invention can be increased. That is, the bottle trench with a larger surface area can be obtained after subsequent processes. Moreover, the minimum distance D between both trenches 408 indicated by the solid lines is longer than the minimum distance d between both trenches 408 indicated by dotted lines (D>d). Accordingly, although the critical dimensions of the trenches 408 indicated by the solid lines are increased, short circuits between the subsequently formed bottle trenches can be prevented due to the longer distance D.

Figure 4J:
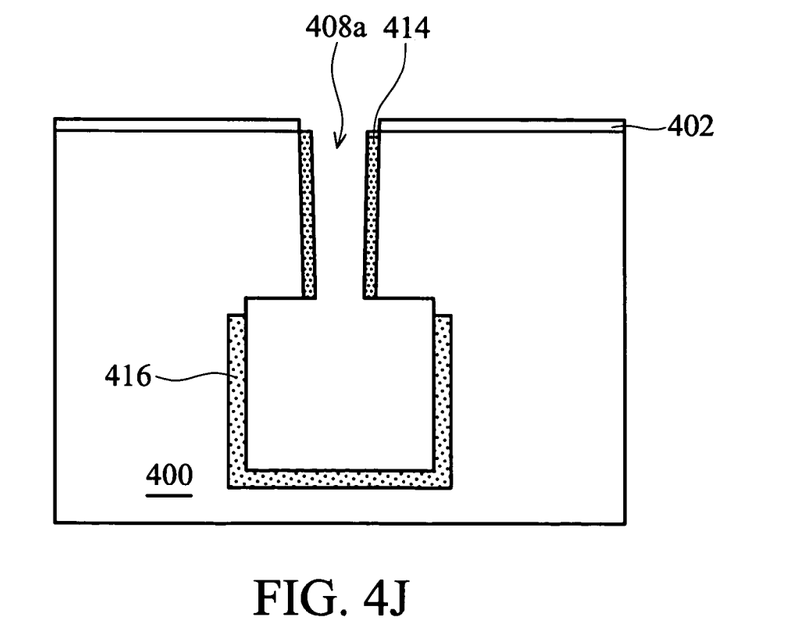

Next, in FIG. 4J, a bottom electrode (buried plate) 416 is formed in the substrate 400 of the bottle trench 408a. For example, a doped dielectric layer (not shown) comprising arsenic silicate glass (ASG) is conformally formed on the sidewall and the bottom of the bottle trench 408a. A thermal treatment is subsequently performed to drive the dopants of the doped dielectric layer into the substrate 400 of the lower portion IV of the bottle trench 408a to form the bottom electrode 416.

Figure 4K:
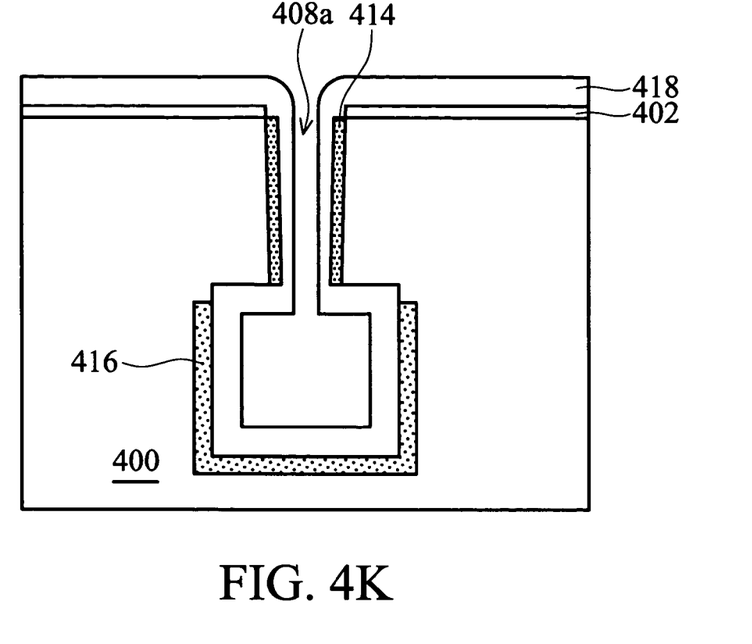

Next, in FIG. 4K, the doped dielectric layer is removed by suitable solution. Thereafter, a dielectric layer 418 is conformally formed on the bottom and the sidewall of the bottle trench 408a.

Figure 4L:
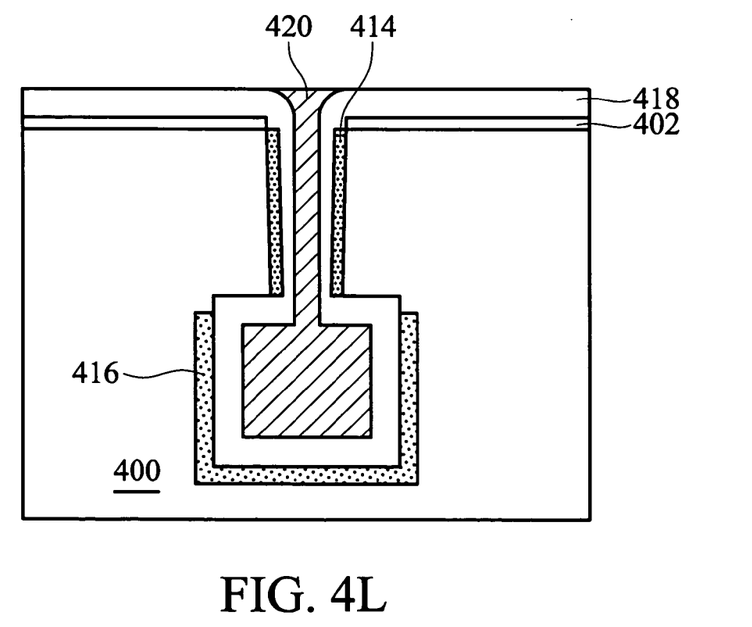

Finally, in FIG. 4L, a conductive layer 420, such as a polysilicon layer, fills the bottle trench 408a. As a result, a bottle trench capacitor is obtained. Since the surface area of the bottle trench 408a is increased, the capacity of the bottle trench capacitor can be increased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a battle trench, comprising:
   providing a substrate covered by a photoresist layer;
   rotating the substrate to a specific angle and performing lithography on the photoresist layer to form a rectangular opening therein and expose the substrate, wherein edges of the rectangular opening are substantially parallel to a {110} plane of the substrate due to rotation of the substrate;
   etching the exposed substrate to form a trench therein, wherein a sidewall surface of the trench is the {110} plane of the substrate;
   forming an etching shield layer on an the upper portion of the sidewall of the trench; and
   isotropically etching a lower portion of the trench using etching shield layer as an etching mask, to form a bottle trench.

2. The method as claimed in claim 1, wherein the substrate comprises silicon.

3. The method as claimed in claim 1, wherein the etching shield layer comprises silicon dioxide.

4. The method as claimed in claim 1, wherein the isotropic etching comprises wet etching.

5. The method as claimed in claim 4, wherein the wet etching using KOH, $NH_4OH$, $HNO_3$, or $NH_3$ as an etching solution.

6. The method as claimed in claim 1, wherein the substrate is rotated from a <100> direction to a <110> direction.

7. The method as claimed in claim 1, wherein the specific angle is 45°, 135°, 225°, or 315°.

8. A method of fabricating a bottle trench capacitor, comprising:
   providing a substrate;
   forming a masking pattern layer overlying the substrate, having a rectangular opening to expose the substrate and edges of the rectangular opening substantially parallel to a {110} plane of the substrate;
   etching the exposed substrate to form a trench therein, wherein a sidewall surface of the trench is the {110} plane of the substrate;
   forming an etching shield layer on the sidewall of an the upper portion of trench;
   isotropically etching a lower portion of the trench using the etching shield layer as an etching mask, to form a bottle trench;
   forming a bottom electrode in the substrate of the lower portion of the bottle trench;
   conformably forming a dielectric layer on the surface of the lower portion of the bottle trench; and
   forming a top electrode in the bottle trench.

9. The method as claimed in claim 8, wherein the formation of the masking pattern layer further comprises:
   forming a photoresist layer on a masking layer;
   rotating the substrate to a specific angle and performing lithography on the photoresist layer, to form a rectangular opening pattern therein and expose the masking layer, wherein edges of the rectangular opening pattern substantially parallel to the {110} plane of the substrate due to rotation of the substrate;
   etching the exposed masking layer to transfer the rectangular opening pattern therein; and
   removing the photoresist layer.

10. The method as claimed in claim 9, wherein the substrate is rotated from a <100> direction to a <110> direction.

11. The method as claimed in claim 9, wherein the specific angle is 45°, 135°, 225°, or 315°.

12. The method as claimed in claim 8, wherein the substrate comprises silicon.

13. The method as claimed in claim 8, wherein the masking pattern layer comprises a pad oxide layer and a silicon nitride layer.

14. The method as claimed in claim 8, wherein the etching shield layer comprises silicon dioxide.

15. The method as claimed in claim 8, wherein the isotropic etching comprises wet etching.

16. The method as claimed in claim 15, wherein the wet etching using KOH, $NH_4OH$, $HNO_3$, or $NH_3$ as an etching solution.

17. The method as claimed in claim 8, wherein the dielectric layer comprises oxide.

18. The method as claimed in claim 8, wherein the top electrode comprises polysilicon.

* * * * *